US 6,556,055 B2

(12) United States Patent
Soldavini

(10) Patent No.: US 6,556,055 B2
(45) Date of Patent: Apr. 29, 2003

(54) DRIVE CIRCUIT FOR CONTROLLED EDGE POWER ELEMENTS

(75) Inventor: Francesco Chrappan Soldavini, San Donato Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/945,317

(22) Filed: Aug. 31, 2001

(65) Prior Publication Data
US 2002/0027455 A1 Mar. 7, 2002

(30) Foreign Application Priority Data
Sep. 5, 2000 (IT) .................... M12000A1950

(51) Int. Cl.[7] .................................. H03B 1/00

(52) U.S. Cl. .............. 327/112; 327/108; 327/170; 327/427

(58) Field of Search ............... 327/108, 109, 327/110, 111, 112, 170, 376, 377, 379, 380, 381, 427, 434, 437, 561, 336, 337

(56) References Cited

U.S. PATENT DOCUMENTS

| 5,191,269 | A | * | 3/1993 | Carbolante | 318/254 |
| 5,469,096 | A | * | 11/1995 | Nessi et al. | 327/112 |
| 5,686,859 | A | * | 11/1997 | Majumdar et al. | 327/530 |
| 5,828,245 | A | * | 10/1998 | Brambilla et al. | 327/108 |
| 5,939,909 | A | * | 8/1999 | Callahan, Jr. | 327/108 |
| 6,271,699 | B1 | * | 8/2001 | Dowlatabadi | 327/170 |
| 6,407,594 | B1 | * | 6/2002 | Milazzo et al. | 327/112 |

* cited by examiner

Primary Examiner—Kenneth B. Wells
Assistant Examiner—Hai L. Nguyen
(74) Attorney, Agent, or Firm—Lisa K. Jorgenson; Robert Iannucci; SEED IP Law Group PLLC

(57) ABSTRACT

A drive circuit for controlled edge power elements is described. In one embodiment the drive circuit for controlled edge power elements comprises: a first integrating circuit having a first input suitable for receiving in input a first drive signal; an integrating capacitor coupled to said integrating circuit; a first power element driven by said first integrating circuit and suitable for driving a load, said load having a first terminal. The said first integrating circuit includes a first current amplifier and said integrating capacitor is coupled between said first input and a predetermined reference voltage.

23 Claims, 3 Drawing Sheets

DRIVE CIRCUIT FOR CONTROLLED EDGE POWER ELEMENTS

BACKGROUND OF THE INVENTION

1. Field of the Invention

The present invention refers to a drive circuit for controlled edge power elements.

2. Description of the Related Art

In the drive circuit of the power elements, the leading and trailing edges of the signals to apply to the load are kept under control, so as to reduce the width of the components in frequency on the load. In particular leading and trailing edges having limited slopes are forced, that is steep edges rich with harmonics are avoided. An integrator is generally used to control the edges by means of a suitable gain stage that drives a power element typically a MOS transistor.

With the reduction of the construction geometries of integrated circuits, the situation is presented in which the breaking stress of the gate oxide of the MOS transistors is lower than the supply voltage of the circuit in which the transistors are used. In this case, in order to avoid the breaking of the gate oxide, it is necessary to limit the voltage variation thereacross coming from the integrator. To limit the output voltage of the integrator one is forced to use voltage clipping circuits that often present inconveniences and complicate the circuit.

In the case of controlled edge halfbridges two drive circuits are necessary, an upper and a lower one. In the upper drive circuit the MOS transistor acts as source follower, while in the lower drive circuit the MOS transistor acts as open drain. The result is that the behavior of the two drive circuits is different and thus the two circuits have to be optimized separately.

In addition, in this case the two circuits are never active contemporarily to avoid phenomena of crossconduction, and the Applicant has perceived that it could reduce the area of silicon occupied if several components were shared between the two circuits.

We now refer to FIG. 1, which shows a drive circuit for controlled edge power elements of the high-side type according to the known art. It comprises a first power element which in FIG. 1 is for example represented by a MOS transistor M1 having the drain connected to a supply voltage Vcc and the source connected to a terminal of a load L, which in turn is connected to ground Gnd. The gate of the transistor M1 is driven by an operational amplifier OP1, which has non-inverting input connected to a reference voltage Vref and an inverting input connected to a terminal of a capacitor C1 and a first terminal of a switch SW1. The other terminal of the capacitor C1 is connected to the load L. The switch SW1 permits, on command of a special circuit not shown in the figure, the commutation of said first terminal between a second and a third terminal. The second terminal is connected to a current generator IH which in turn is connected to the supply voltage Vcc. The third terminal is connected to a current generator IL which in turn is connected to ground Gnd. The generator IH supplies current to the capacitor C1, while the generator IL extracts current from the capacitor C1.

The drive circuit therefore comprises an integrating circuit comprising an operational amplifier OP1 and the capacitor C1, which withdrawing the voltage on the load L and having a charge and discharge current determined by the current generators IH and IL permits the slope of the leading and trailing edges applied to load L to be controlled.

We now refer to FIG. 2 which shows a drive circuit for controlled edge power elements of the halfbridge type according to the known art. It comprises all the circuit elements shown in FIG. 1 that keep the same numerical references, with exception of the L, which in this case has one terminal (Out) connected to transistor M1 and the other terminal is not shown in the figure and can be connected to ground Gnd or to another halfbridge like that represented here. It comprises, in addition, a second power element (low-side) which in the figure is for example represented by a MOS transistor M2 having the drain connected to the terminal of the load L and to the source of the transistor M1, the source of the transistor M2 is connected to ground Gnd. In alternative the source could be connected to a negative voltage −Vcc. The gate of the transistor M2 is driven by an operational amplifier OP2 which has the inverting input connected to a reference voltage Vref and a non-inverting input connected to a terminal of a capacitor C2 and a first terminal of a switch SW2. The other terminal of the capacitor C2 is connected to the load L. The switch SW2 permits, upon command from a special circuit which is not shown in the figure, to commutate said first terminal between a second and a third terminal. The second terminal is connected to a current generator IH2 which in turn is connected to the supply voltage Vcc. The third terminal is connected to a current generator IL2 which in turn is connected to ground Gnd. The generator IH2 supplies current to the capacitor C2, while the generator IL2 extracts a current from the capacitor C2.

It can be noted that in the upper drive circuit the transistor M1 acts as source follower, while in the lower drive circuit the transistor M2 acts as open drain.

BRIEF SUMMARY OF THE INVENTION

An embodiment of the present invention provides a drive circuit for controlled edge power elements that does not have the inconveniences of the known art.

The drive circuit comprises: a first integrating circuit having a first input suitable for receiving in input a first drive signal; an integrating capacitor coupled to said integrating circuit; a first power element driven by said first integrating circuit and suitable for driving a load, said load having a first terminal; characterized in that said first integrating circuit includes a first current amplifier and that said integrating capacitor is coupled between said first input and a predetermined reference voltage.

Thanks to the present invention, not coupling the integrating capacitor directly to the load, it is possible to prevent the recirculation voltages under-ground and over-voltage present on the load from activating parasitic effects depending on the construction of the capacitor on silicon; and in addition an open drain type drive circuit is obtained which permits the division of the voltage gain between the current amplifier and the power element.

In addition thanks to the present invention drive circuits for controlled edge power elements can be realized that eliminate the use of clipping circuits. There is the possibility of using low voltage components for the drive of the power elements and in particular CMOS components which are less sensitive to the problems of under-ground and over-voltage typical of the drive stages of inductive loads such as motors and solenoids. In addition, in the case of controlled edge halfbridges symmetrical drive circuits are obtained, and only one integrating capacitance is used saving considerable space on the silicon.

BRIEF DESCRIPTION OF THE SEVERAL VIEWS OF THE DRAWINGS

The characteristics and the advantages of the present invention will be evident from the following detailed description of an embodiment thereof, illustrated as non-limiting example in the enclosed drawings, in which.

DETAILED DESCRIPTION OF THE INVENTION

Figure 1:
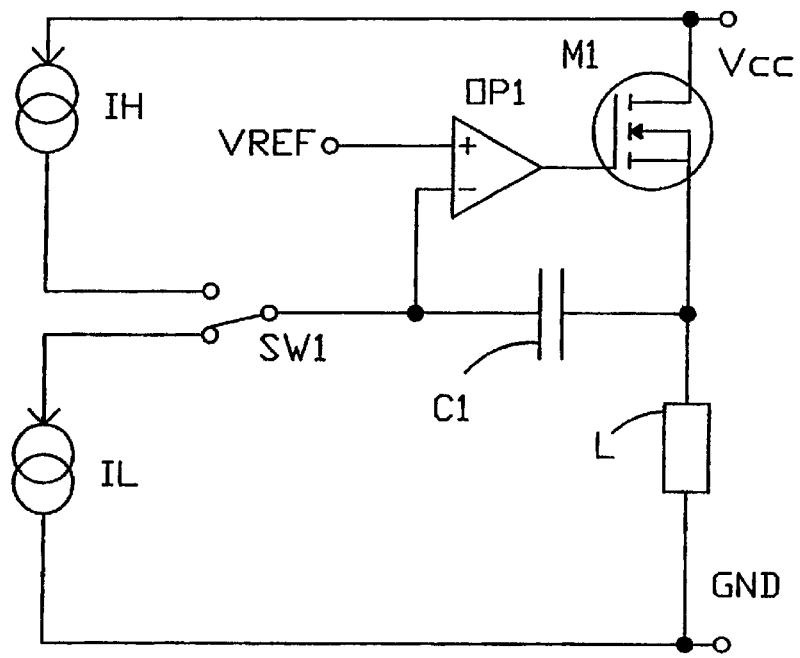
FIG. 1 shows a drive circuit for controlled edge power elements of the high-side type according to the known art.
Figure 3:
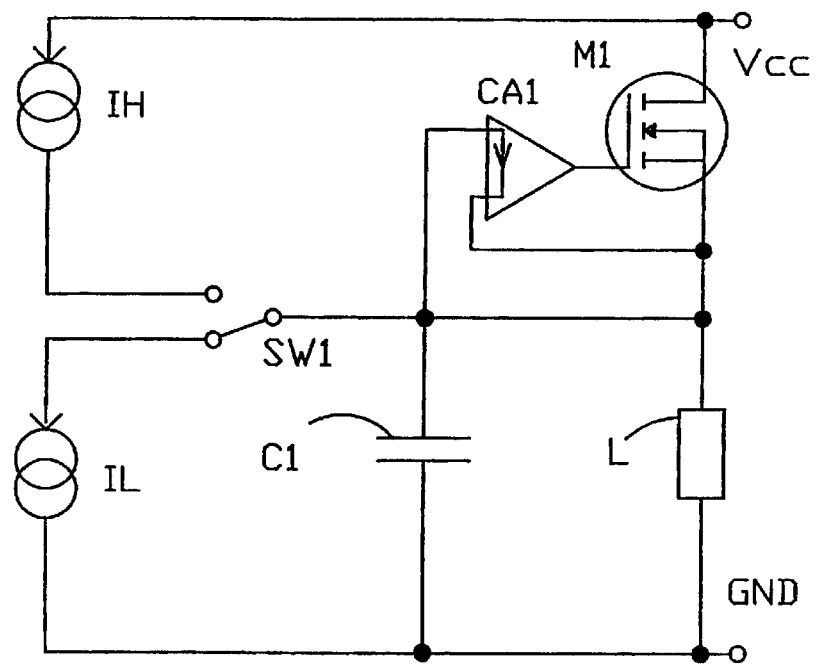
FIG. 3 shows a drive circuit for controlled edge power elements of the high-side type in accordance with a first embodiment of the present invention.

We now refer to the FIG. 3 which shows a drive circuit for controlled edge power elements of the high-side type in accordance with a first embodiment of the present invention. It corresponds to the circuit shown in FIG. 1 with the exception of the fact that the operational amplifier OP1 has been replaced by a current amplifier CA1 which has a positive input connected to the capacitor C1 and a negative input connected to the load L, and the capacitor C1 is connected between the positive input of the current amplifier CA1, and therefore also to the first terminal of the switch SW1, and a predetermined reference voltage which in the example shown in FIG. 3 corresponds to ground Gnd.

The path of the signal in the integrating circuit can result as not being evident but carries out the following path: CA1, M1, Vcc, Gnd, C1. In this case the transistor M1 acts as open drain.

The drive circuit thus comprises an integrating circuit constituted by the current amplifier CA1 and the capacitor C1, which adjusts the voltage on the load L and has a charge and discharge current determined by the current generators IH and IL which permits the slope of the leading and trailing edges applied to the load L to be controlled.

The current generator CA1 is supplied in this case between the supply voltage Vcc and ground Gnd.

Figure 4:
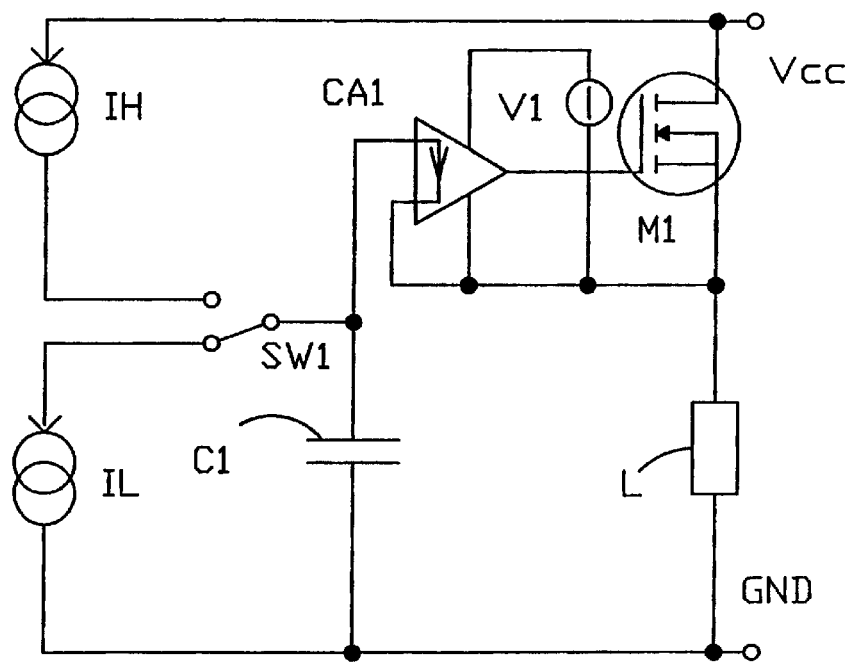
FIG. 4 shows a drive circuit for controlled edge power elements of the high-side type in accordance with a second embodiment of the present invention.

We now refer to FIG. 4 which shows a drive circuit for controlled edge power elements of the high-side type in accordance with a second embodiment of the present invention. It corresponds to the circuit shown in FIG. 3 except for the fact that, in accordance with the present invention, it is possible to supply the current amplifier CA1 by means of a voltage generator V1, between the voltage V1 and the reference voltage present on the source of the transistor M1. It therefore results possible to supply the current amplifier CA1 between the source of the transistor M1 and a suitable voltage supplied by the voltage generator V1 with a voltage equal to the voltage of the source of the transistor M1 increased by a suitable value lower than the breaking stress of the gate oxide of the transistor M1, and consequently lower than the supply voltage Vcc. In this case the problem of having to introduce the voltage clipping circuits applied to the gate of the transistor M1 is resolved. Another advantage is being able to use low voltage components for the current amplifier CA1 and in particular CMOS components which are known to be less sensitive to problems of underground and over-voltage typical of the drive stages of inductive loads such as motors and solenoids.

Figure 2:
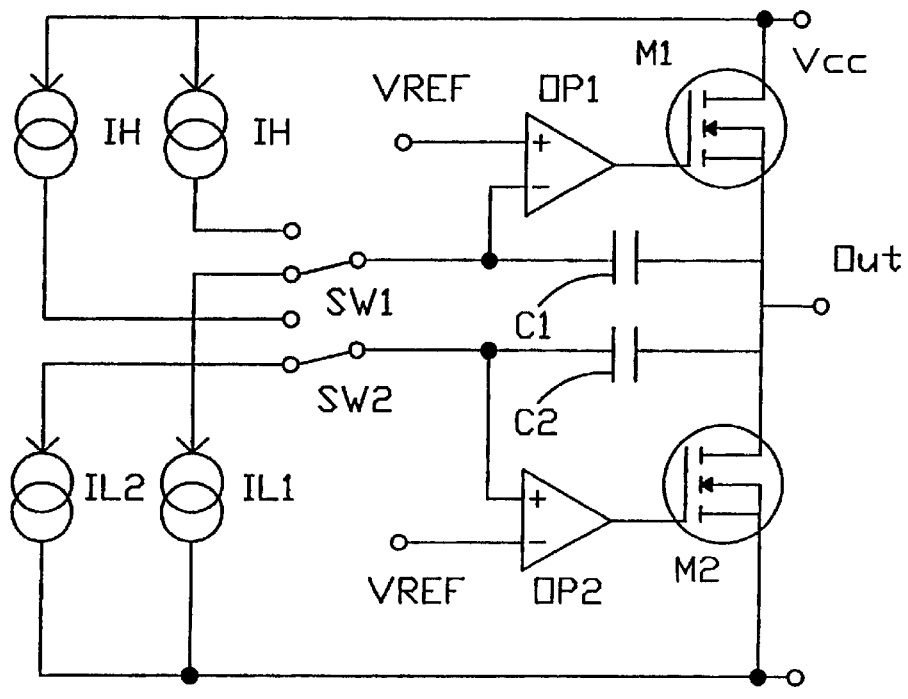
FIG. 2 shows a drive circuit for controlled edge power elements of the halfbridge type according to the known art.
Figure 5:
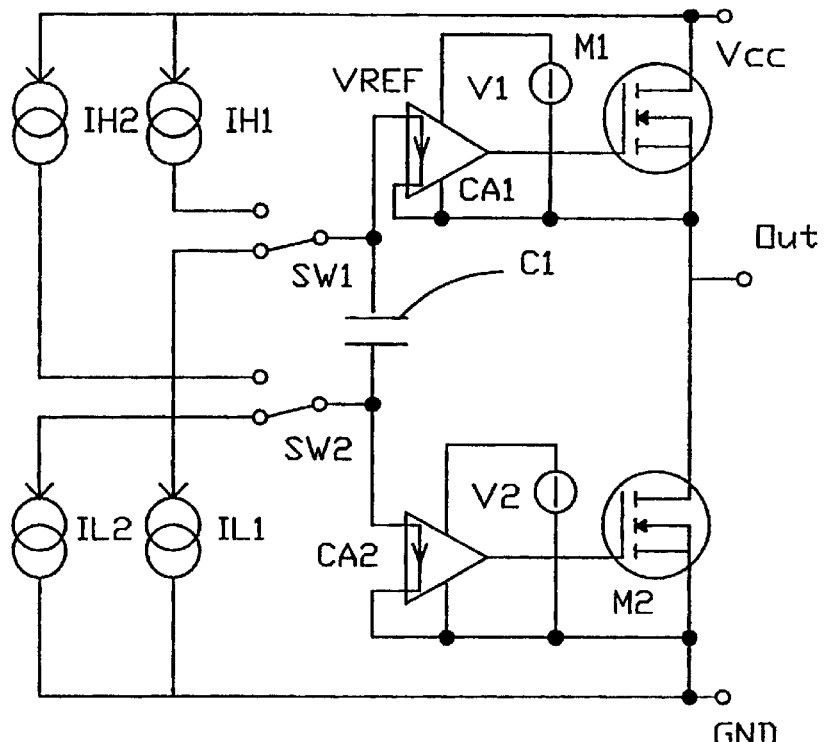
FIG. 5 shows a drive circuit for controlled edge power elements of the halfbridge type in accordance with an embodiment of the present invention.

We now refer to FIG. 5 which shows a drive circuit for controlled edge power elements of the halfbridge type in accordance with an embodiment of the present invention. It comprises all the circuit elements shown in FIG. 4 which keep the same numerical references, with exception of the load L, which in this case has one terminal (Out) connected to the transistor M1 and the other terminal is not shown in the figure and can be connected to ground Gnd or to another halfbridge like that represented here. In addition it comprises a second power element which in the figure is for example represented by a MOS transistor M2 having the drain connected to the terminal of the load L and to the source of the transistor M1, and the source of the transistor M2 is connected to ground Gnd. In alternative the source could be connected to a negative voltage −Vcc. The gate of the transistor M2 is driven by a current amplifier CA2 which has a positive input connected to the capacitor C1 and a negative input connected to ground Gnd. The capacitor C1 is thus connected between the positive input of the current amplifier CA1, and therefore also to the first terminal of the switch SW1, and the positive input of the current amplifier CA2, and therefore also to a first terminal of the switch SW2. As in FIG. 2 the switch SW2 permits, upon command of a suitable circuit not shown in figure, to commutate said first terminal between a second and a third terminal. The second terminal is connected to a current generator Ih2 which in turn is connected to the supply voltage Vcc. The third terminal is connected to a current generator Il2 which in turn is connected to ground Gnd.

As in FIG. 3 the capacitor C1 can be considered connected between the positive input of the current amplifier CA1 and a predetermined reference voltage which also in this case for the signal corresponds to a virtual ground, as for an ideal current amplifier the input resistance is substantially equal to 0, in other words between the positive input and the negative input of the current amplifier CA1 there is substantially a short circuit for the signal.

It can be noted that both in the upper drive circuit and the lower drive circuit, the transistor M1 and the transistor M2 act as open drain, in other words the two drive circuits are symmetrical Also in this case the two current amplifiers CA1 and CA2 can be supplied by two power supplies, respectively V1 and V2 which supply a voltage lower than the breaking stress of the gate oxide of the transistors M1 and M2, and consequently lower than the supply voltage of the transistors themselves.

The negative inputs of the current amplifiers CA1, CA2 have voltages that are less, in absolute value, than a voltage at the positive input of the first current amplifier CA1 or than a voltage at the positive input of the second current amplifier CA2.

Figure 6:
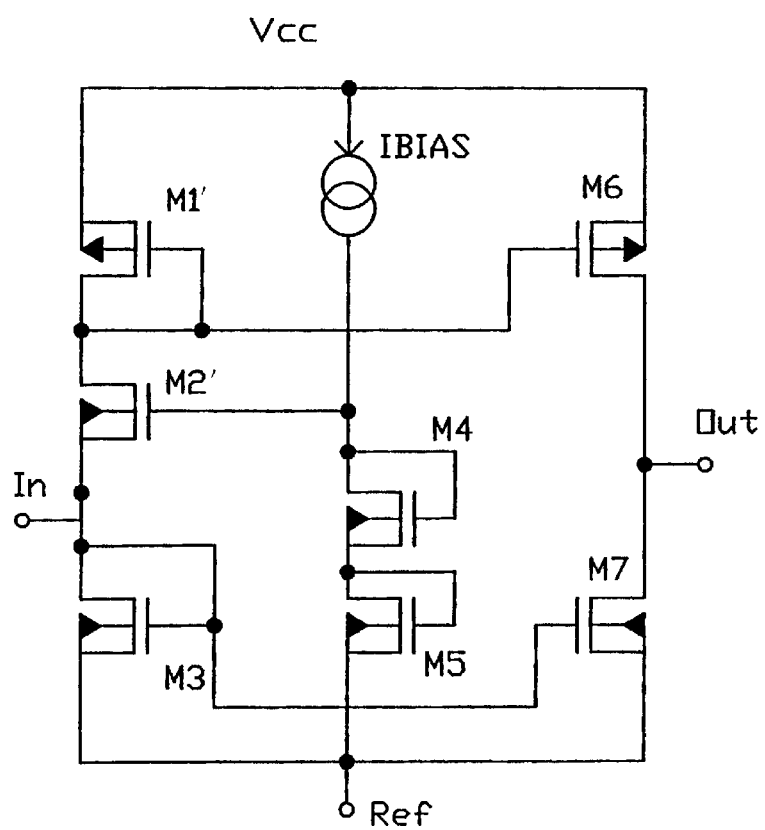
FIG. 6 shows a current amplifier in accordance with the present invention.

We now refer to FIG. 6 which shows a current amplifier CA1, CA2 in accordance with the present invention, which is supplied by the voltage generators V1 and possibly V2. It comprises a positive input In+ which is connected to the drain of an NMOS transistor M3 connected to a diode that is with the drain connected to its gate and its source connected to a reference input Ref. The drain of the transistor M3 is connected to the source of an NMOS transistor M2' whose drain is connected to the drain of a PMOS transistor M1' connected to the diode that is with the drain connected to its gate and its source connected to supply voltage Vcc. The gate of the transistor M1' is connected to the gate of a PMOS transistor M6 whose source is connected to the supply voltage Vcc and its drain is connected to the output terminal Out of the amplifier. The gate of the transistor M3 is connected to the gate of an NMOS transistor M7 whose drain is connected to the output terminal Out of the amplifier and its source is connected to the reference input Ref. The gate of the transistor M2' is connected to the drain of an NMOS transistor M4 connected to a diode that is with the drain connected to its gate and its source connected to the drain of an NMOS transistor M5 connected to the diode that is with the drain connected to its gate and its source connected to the reference input Ref The gate of the transistor M2' is also connected to a current generator Ibias which in turn is connected to the supply voltage Vcc.

The positive input In+ corresponds to the positive input of the current amplifiers CA1 and CA2, the reference input Ref corresponds to the negative input of the current amplifiers CA1 and CA2.

The transistors M4 and M5 and the current generator Ibias are sized so as to bias the gate of the transistor M2' at a voltage which is lower than the sum of the threshold voltages of the transistors M2' and M3. If the current at the input is null, M3, M2', and M1' will be off and consequently also the transistors M6 and M7. In this condition the current absorbed by the supply is the only current Ibias that can be made very small. This characteristic is particularly interesting in the applications of driving power stages, in which current at the stage is requested only during the transistors of the output, so as to reduce the average power absorbed by the system.

If the current at the input of the amplifier is positive, that is enters from the positive input In+, the transistor M3 will turn on forcing the transistors M7 to turn on, while M2', M1', and M6 will remain off. Suitably choosing the relation among the dimensions between the transistors M7 and M3 it is possible to set the current gain of the amplifier in these conditions. If vice versa the current at the positive input In+ is in output, the transistor M2' will turn on forcing M1' and M6 to turn on while the transistors M3 and M7 will remain off. Suitably choosing the relation among the dimensions between the transistors M6 and M1' it is possible to set the current gain of the amplifier in these conditions.

The transistors M1', M2', and M3 form the input branch, the transistors M4, M5 and the current generator Ibias form bias branch and the transistors M6 and M7 form the output branch.

In accordance with the present invention with a current amplifier as described a circuit simplicity accompanied by a reduced consumption of current at idle state and during operation, as either the upper stages (M1', M2', and M6) or the lower stages (M3, M7) operate alternatively and the possibility of having an asymmetrical gain are obtained.

The transistor M2' behaves like a switch commanded by the bias voltage supplied by the bias branch so that it can activate only when the current is in output from the input In, and consequently activating the upper stages. The lower stages are activated directly by the incoming current from the input In.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

I claim:

1. Drive circuit for controlled edge power elements comprising:
   a first integrating circuit having a first input suitable for receiving in input a first drive signal;
   an integrating capacitor coupled between said first input of said first integrating circuit and a predetermined reference voltage; and
   a first power element driven by said first integrating circuit and suitable for driving a load, said load having a first terminal; wherein
   said first integrating circuit includes a first current amplifierthat includes:
      an input branch having a first input for receiving the first drive signal and a second input coupled to the load;
      an output branch coupled to said input branch; and
      a bias branch suitable for biasing said input branch; wherein said input branch comprises a switch commanded by a bias voltage supplied by said bias branch so as to block current flowing in said input branch and consequently current flowing in said output branch when a voltage applied to said first input of the input branch is null.

2. Drive circuit in accordance with claim 1 wherein said predetermined reference voltage corresponds to ground.

3. Drive circuit in accordance with claim 1 wherein said first power element possesses a control terminal, an input terminal, and an output terminal, said control terminal is coupled to an output of said first integrating circuit, said input terminal is coupled to a supply voltage and said output terminal is coupled to said first terminal of said load.

4. Drive circuit in accordance with claim 1 wherein said first integrating circuit comprises a second input connected to said load.

5. Drive circuit in accordance with claim 1 wherein said first integrating circuit is supplied between a supply voltage and a voltage present on said first terminal of said load.

6. Drive circuit in accordance with claim 1, further comprising a second integrating circuit having a second input suitable for receiving in input a second drive signal and including a second current amplifier and a second power element driven by said second integrating circuit and suitable for driving said load.

7. Drive circuit in accordance with claim 6 wherein said integrating capacitor is coupled between said first input and said second input.

8. Drive circuit in accordance with claim 6 wherein said second power element possesses a control terminal, an input terminal, and an output terminal, said control terminal is coupled to an output of said second integrating circuit, said input terminal is coupled to said first terminal of said load and said output terminal is coupled to the predetermined reference voltage.

9. Drive circuit in accordance with claim 6 wherein said second integrating circuit comprises a third input connected to said predetermined reference voltage.

10. Drive circuit in accordance with claim 6 wherein said second integrating circuit is supplied between a supply voltage and said predetermined reference voltage.

11. Drive circuit in accordance with claim 6 wherein said first integrating circuit includes a third input and the second integrating circuit includes a fourth input and voltages at said third and fourth inputs are less, in absolute value, than a voltage at said first input or than a voltage at said second input.

12. A drive circuit for controlled edge power elements, comprising:

a first power element coupled between a first voltage reference and a first terminal of a load, the first power element having a control terminal;

a first current amplifier having a first input, a second input, and an output, the second input being coupled to the first terminal of the load and the output being coupled to the control terminal of the first power element;

an integrating capacitor having a first terminal coupled to the first input of the first current amplifier and a second terminal coupled to a second reference voltage a second power element coupled between the first terminal of the load and the second reference voltage, the second power element having a control terminal; and a second current amplifier having a first input coupled to the second terminal of the capacitor, a second input coupled to the second voltage reference, and an output coupled to the control terminal of the second power element.

13. The drive circuit of claim 12, further comprising:

a first voltage generator coupled between first and second supply terminals of the first current amplifier, the second supply terminal being coupled to the second input of the first current amplifier; and a second voltage generator having a first terminal coupled to a first supply terminal of the second current amplifier and a second terminal coupled to a second supply terminal and the second input of the second current amplifier.

14. The drive circuit of claim 12, further comprising:

a first current generator coupled between the first input of the first current amplifier and the first reference voltage;

a second current generator coupled between the first input of the first current amplifier and the second reference voltage; and a control switch having a first conduction terminal coupled to the first input of the first current amplifier, a second conduction terminal coupled to the first current generator, and a third conduction terminal coupled to the second current generator such that the control switch alternately electrically connects the first input to the first and second current generators, respectively.

15. The drive circuit of claim 12, further comprising a voltage generator coupled between first and second supply terminals of the first current amplifier, the second supply terminal being coupled to the second input of the first current amplifier.

16. The drive circuit of claim 12, further comprising:

a first current generator coupled between the first input of the first current amplifier and the first reference voltage;

a second current generator coupled between the first input of the first current amplifier and the second reference voltage; and a first control switch having a first conduction terminal coupled to the first input of the first current amplifier, a second conduction terminal coupled to the first current generator, and a third conduction terminal coupled to the second current generator such that the first control switch alternately electrically connects the first input of the first current amplifier to the first and second current generators, respectively.

17. The drive circuit of claim 16, further comprising:

a third current generator coupled between the first input of the second current amplifier and the first reference voltage;

a fourth current generator coupled between the first input of the second current amplifier and the second reference voltage; and a second control switch having a first conduction terminal coupled to the first input of the second current amplifier, a second conduction terminal coupled to the third current generator, and a third conduction terminal coupled to the fourth current generator such that the second control switch alternately electrically connects the first input of the second current amplifier to the third and fourth current generators, respectively.

18. A drive circuit for controlled edge power elements, comprising:

a first power element coupled between a first voltage reference and a first terminal of a load, the first power element having a control terminal; and a first current amplifier that includes:

a first current generator having first and second terminals, the first terminal being coupled to the first voltage reference;

a first input switch coupled between the first voltage reference and a first input node, and having a control terminal;

a first output switch coupled between the first voltage reference and the control terminal of the first power element, and having a control terminal;

a first control switch coupled to the first input node and to the control terminals of the input and output switches, the first control switch having a control terminal coupled to the second terminal of the first current generator an integrating capacitor having a first terminal coupled to the first input node and a second terminal coupled to a second reference voltage;

a second power element coupled between the first terminal of the load and a second reference voltage, the second power element having a control terminal; and a second current amplifier having a first input coupled to the second terminal of the capacitor, a second input coupled to the second voltage reference, and an output coupled to the control terminal of the second power element.

19. The drive circuit of claim 18, further comprising:

a second voltage generator coupled between first and second supply terminals of the first current amplifier; and a third voltage generator having a first terminal coupled between first and second supply terminals of the second current amplifier.

20. The drive circuit of claim 18, further comprising:

a second current generator coupled between the first input node of the first current amplifier and the first reference voltage;

a third current generator coupled between the first input node of the first current amplifier and the second reference voltage;

a second control switch having a first conduction terminal coupled to the first input node of the first current amplifier, a second conduction terminal coupled to the second current generator, and a third conduction terminal coupled to the third current generator such that the second control switch alternately electrically connects the first input node of the first current amplifier to the second and third current generators, respectively;

a fourth current generator coupled between the first input of the second current amplifier and the first reference voltage;

a fifth current generator coupled between the first input of the second current amplifier and the second reference voltage; and a third control switch having a first conduction terminal coupled to the first input of the second current amplifier, a second conduction terminal coupled to the fourth current generator, and a third conduction terminal coupled to the fifth current generator such that the second control switch alternately electrically connects the first input of the second current amplifier to the fourth and fifth current generators, respectively.

21. The drive circuit of claim 18, further comprising:

a second input switch coupled between the first input node and the first terminal of the load;

a second output switch coupled between the control terminal of the first power element and the first terminal of the load, the second output switch having a control terminal coupled to a control terminal of the second input switch; and a diode coupled between the second terminal of the first current generator and the first terminal of the load.

22. The drive circuit of claim 18, further comprising:

a second current generator coupled between the first input node and the first reference voltage;

a third current generator coupled between the first input node and a second reference voltage; and a first control switch having a first conduction terminal coupled to the first input node, a second conduction terminal coupled to the first current generator, and a third conduction terminal coupled to the second current generator such that the control switch alternately electrically connects the first input node to the first and second current generators, respectively.

23. The drive circuit of claim 18, further comprising a voltage generator coupled between first and second supply terminals of the first current amplifier.

* * * * *